US007417420B2

(12) United States Patent
Shuey

(10) Patent No.: US 7,417,420 B2
(45) Date of Patent: Aug. 26, 2008

(54) SWITCH TO BYPASS OPTICAL DIODE FOR REDUCING POWER CONSUMPTION OF ELECTRICAL METERS

(75) Inventor: Kenneth C. Shuey, Zebulon, NC (US)

(73) Assignee: Elster Electricity, LLC, Raleigh, NC (US)

(*) Notice: Subject to any disclaimer, the term of this patent is extended or adjusted under 35 U.S.C. 154(b) by 0 days.

(21) Appl. No.: 11/772,405

(22) Filed: Jul. 2, 2007

(65) Prior Publication Data

US 2008/0012550 A1 Jan. 17, 2008

Related U.S. Application Data

(62) Division of application No. 10/803,212, filed on Mar. 18, 2004, now Pat. No. 7,315,162.

(51) Int. Cl.
 *G01R 11/32* (2006.01)
(52) U.S. Cl. .................... 324/158.1; 324/142
(58) Field of Classification Search .................. None
 See application file for complete search history.

(56) References Cited

U.S. PATENT DOCUMENTS

| 3,445,815 | A | 5/1969 | Saltzberg et al. ............ 340/163 |
| 3,858,212 | A | 12/1974 | Tompkins et al. ..... 343/100 CS |
| 3,875,346 | A | 4/1975 | O'Dea et al. ................ 379/236 |
| 3,878,512 | A | 4/1975 | Kobayashi et al. ....... 340/168 R |
| 3,973,240 | A | 8/1976 | Fong .......................... 340/151 |
| 3,976,941 | A | 8/1976 | Milcovic .................... 324/142 |
| 4,023,887 | A | 5/1977 | Speers ......................... 385/50 |
| 4,031,513 | A | 6/1977 | Simciak .................... 340/152 T |
| 4,056,107 | A | 11/1977 | Todd et al. ................. 130/27 R |
| 4,060,803 | A | 11/1977 | Ashworth, Jr. ............... 340/506 |

(Continued)

FOREIGN PATENT DOCUMENTS

AU 87/68113 8/1987

(Continued)

OTHER PUBLICATIONS

Desbonnet, J. et al., "System Architecture and Implementation of a CEBus/Internet Gateway," *IEEE Transactions on Consumer Electronics*, 1997, 43(4), pp. 1057-1062.

(Continued)

*Primary Examiner*—Paresh Patel
(74) *Attorney, Agent, or Firm*—Woodcock Washburn LLP

(57) ABSTRACT

The invention contemplates an electrical power meter and method of operating the electrical power meter. The inventive power meter includes a power supply for converting alternating current (AC) voltage to a direct current (DC) voltage for powering the electronic components, and an optical diode in series with the power supply. The meter may also include an optical communications port in communication with the optical diode and/or a switch (e.g., a transistor) in communication with the optical diode. The switch may be in parallel with the optical diode, and allow DC current to bypass the optical diode when a request for communication is received by the meter. The DC current provided to the optical diode represents communication of data with an optical communications port. The switch may be controlled by a microprocessor device.

15 Claims, 3 Drawing Sheets

U.S. PATENT DOCUMENTS

| | | | | |
|---|---|---|---|---|
| 4,132,981 A | 1/1979 | White | ........................ | 340/203 |
| 4,156,273 A | 5/1979 | Sato | ........................ | 363/21.16 |
| 4,190,800 A | 2/1980 | Kelly, Jr. et al. | ............... | 325/37 |
| 4,204,195 A | 5/1980 | Bogacki | ........................ | 340/151 |
| 4,209,826 A | 6/1980 | Priegnitz | ................. | 363/21.07 |
| 4,218,737 A | 8/1980 | Buscher et al. | .............. | 364/493 |
| 4,250,489 A | 2/1981 | Dudash et al. | ............ | 340/147 T |
| 4,254,472 A | 3/1981 | Juengel et al. | ............... | 364/900 |
| 4,274,082 A | 6/1981 | Litz et al. | .............. | 340/825.62 |
| 4,301,508 A | 11/1981 | Anderson et al. | .............. | 702/58 |
| 4,319,358 A | 3/1982 | Sepp | ........................ | 375/1 |
| 4,321,582 A | 3/1982 | Banghart | ................ | 340/310 R |
| 4,360,879 A | 11/1982 | Cameron | ........................ | 702/60 |
| 4,361,890 A | 11/1982 | Green, Jr. et al. | .............. | 375/1 |
| 4,389,702 A | 6/1983 | Clemente et al. | .............. | 363/56 |
| 4,405,829 A | 9/1983 | Rivest et al. | ............. | 178/22.14 |
| 4,415,896 A | 11/1983 | Allgood | ................. | 340/870.03 |
| 4,417,140 A | 11/1983 | Adolfsson et al. | ...... | 250/227.23 |
| 4,437,059 A | 3/1984 | Hauptmann | ................. | 324/142 |
| 4,438,485 A | 3/1984 | Voigt | ........................ | 363/21.1 |
| 4,465,970 A | 8/1984 | DiMassimo et al. | ......... | 324/116 |
| 4,466,001 A | 8/1984 | Moore et al. | ........... | 340/825.08 |
| 4,497,017 A | 1/1985 | Davis | ........................ | 363/49 |
| 4,504,831 A | 3/1985 | Jahr et al. | .............. | 340/870.03 |
| 4,506,386 A | 3/1985 | Ichikawa et al. | ............. | 455/343 |
| 4,525,861 A | 6/1985 | Freeburg | ........................ | 455/33 |
| 4,566,060 A | 1/1986 | Hoeksma | ................... | 363/131 |
| 4,600,923 A | 7/1986 | Hicks et al. | .............. | 340/870.02 |
| 4,607,320 A | 8/1986 | Matui et al. | .............. | 363/21.17 |
| 4,608,699 A | 8/1986 | Batlivala et al. | ............. | 375/216 |
| 4,611,333 A | 9/1986 | McCallister et al. | ........... | 375/1 |
| 4,614,945 A | 9/1986 | Brunius et al. | ......... | 340/870.02 |
| 4,617,566 A | 10/1986 | Diamond | ............... | 340/870.11 |
| 4,622,627 A | 11/1986 | Rodriguez et al. | ............. | 363/37 |
| 4,623,960 A | 11/1986 | Eng | ........................ | 363/21.08 |
| 4,628,313 A | 12/1986 | Gombrich et al. | ...... | 340/870.02 |
| 4,631,538 A | 12/1986 | Carreno | ................. | 340/870.18 |
| 4,638,298 A | 1/1987 | Spiro | ........................ | 340/827 |
| 4,644,321 A | 2/1987 | Kennon | ................... | 340/310 A |
| 4,653,076 A | 3/1987 | Jerrim et al. | ................. | 375/115 |
| 4,680,704 A | 7/1987 | Konicek et al. | .............. | 364/525 |
| 4,688,038 A | 8/1987 | Giammarese | ........... | 340/870.02 |
| 4,692,761 A | 9/1987 | Robinton | ........... | 340/825.01 |
| 4,700,280 A | 10/1987 | Onda et al. | ..................... | 363/19 |
| 4,707,852 A | 11/1987 | Jahr et al. | .................... | 379/107 |
| 4,713,837 A | 12/1987 | Gordon | ........................ | 379/93 |
| 4,724,435 A | 2/1988 | Moses et al. | ........... | 340/870.13 |
| 4,728,950 A | 3/1988 | Hendrikson et al. | .... | 340/870.31 |
| 4,734,680 A | 3/1988 | Gehman et al. | ............ | 340/539 |
| 4,749,992 A | 6/1988 | Fitzmeyer et al. | ....... | 340/870.02 |
| 4,757,456 A | 7/1988 | Benghiat | .................... | 364/464 |
| 4,761,725 A | 8/1988 | Henze | ........................ | 363/46 |
| 4,769,772 A | 9/1988 | Dwyer | ........................ | 364/300 |
| 4,783,748 A | 11/1988 | Swarztrauber et al. | ....... | 364/483 |
| 4,827,514 A | 5/1989 | Ziolko et al. | .................. | 380/48 |
| 4,837,787 A * | 6/1989 | Takesue et al. | ........... | 372/29.02 |
| 4,839,645 A | 6/1989 | Lill | ........................ | 340/870.17 |
| 4,841,545 A | 6/1989 | Endo et al. | ........................ | 375/1 |
| 4,860,379 A | 8/1989 | Schoeneberger et al. | ........ | 455/5 |
| 4,862,493 A | 8/1989 | Venkataraman et al. | ..... | 379/107 |
| 4,866,587 A | 9/1989 | Wadlington | ................... | 363/16 |
| 4,868,877 A | 9/1989 | Fischer | ........................ | 380/25 |
| 4,884,021 A | 11/1989 | Hammond et al. | .......... | 324/142 |
| 4,912,722 A | 3/1990 | Carlin | ........................ | 375/1 |
| 4,922,399 A | 5/1990 | Tsuzuki | ................... | 363/21.08 |
| 4,940,974 A | 7/1990 | Sojka | ................... | 340/825.08 |
| 4,940,976 A | 7/1990 | Gastouniotis et al. | .. | 340/870.02 |
| 4,956,761 A | 9/1990 | Higashi | ........................ | 363/19 |
| 4,958,359 A | 9/1990 | Kato | ........................ | 375/1 |
| 4,964,138 A | 10/1990 | Nease et al. | ..................... | 375/1 |
| 4,965,533 A | 10/1990 | Gilmore | ........................ | 331/18 |
| 4,972,507 A | 11/1990 | Lusignan | ..................... | 455/51 |
| 4,975,592 A | 12/1990 | Hahn et al. | ..................... | 307/38 |
| 4,978,911 A | 12/1990 | Perry et al. | ................. | 324/142 |
| 5,019,955 A | 5/1991 | Hoeksma | ................. | 363/21.07 |
| 5,022,046 A | 6/1991 | Morrow, Jr. | .................... | 375/1 |
| 5,032,833 A | 7/1991 | Laporte | ............. | 340/825.02 |
| 5,053,766 A | 10/1991 | Ruiz-del-Portal et al. | ..................... | 340/870.02 |
| 5,053,774 A | 10/1991 | Schuermann et al. | ......... | 342/44 |
| 5,056,107 A | 10/1991 | Johnson et al. | ................. | 375/1 |
| 5,067,136 A | 11/1991 | Arthur et al. | .................... | 375/1 |
| 5,079,715 A | 1/1992 | Venkataraman et al. | ..... | 364/481 |
| 5,086,292 A | 2/1992 | Johnson et al. | ............. | 340/637 |
| 5,090,024 A | 2/1992 | Vander Mey et al. | ........... | 375/1 |
| 5,111,479 A | 5/1992 | Akazawa | ........................ | 375/1 |
| 5,115,448 A | 5/1992 | Mori | ........................ | 375/1 |
| 5,132,985 A | 7/1992 | Hashimoto et al. | ............... | 375/1 |
| 5,136,614 A | 8/1992 | Hiramatsu et al. | ............. | 375/1 |
| 5,140,511 A | 8/1992 | Lee et al. | ................. | 363/21.07 |
| 5,142,694 A | 8/1992 | Jackson et al. | ............. | 455/67.1 |
| 5,151,866 A | 9/1992 | Glaser et al. | ................. | 364/483 |
| 5,155,481 A | 10/1992 | Brennan, Jr. et al. | ... | 340/870.02 |
| 5,160,926 A | 11/1992 | Schweitzer, III | ........ | 340/870.02 |
| 5,166,664 A | 11/1992 | Fish | ........................ | 340/539 |
| 5,175,675 A | 12/1992 | Uramoto | ..................... | 363/19 |
| 5,177,767 A | 1/1993 | Kato | ........................ | 375/1 |
| 5,179,376 A | 1/1993 | Pomatto | ................. | 340/870.02 |
| 5,189,694 A | 2/1993 | Garland | ..................... | 379/106 |
| 5,194,860 A | 3/1993 | Jones et al. | ............. | 340/370.02 |
| 5,204,877 A | 4/1993 | Endo et al. | ........................ | 375/1 |
| 5,214,587 A | 5/1993 | Green | ................. | 364/464.04 |
| 5,225,994 A | 7/1993 | Arinobu et al. | ............. | 364/492 |
| 5,228,029 A | 7/1993 | Kotzin | ..................... | 370/95.1 |
| 5,229,996 A | 7/1993 | Bäckström et al. | ........ | 370/100.1 |
| 5,239,575 A | 8/1993 | White et al. | ................. | 379/107 |
| 5,239,584 A | 8/1993 | Hershey et al. | ............... | 380/28 |
| 5,243,338 A | 9/1993 | Brennan, Jr. et al. | ... | 340/870.02 |
| 5,252,967 A | 10/1993 | Brennan et al. | ......... | 340/870.02 |
| 5,260,943 A | 11/1993 | Comroe et al. | ............. | 370/95.1 |
| 5,268,633 A | 12/1993 | Balch | ........................ | 324/74 |
| 5,270,704 A | 12/1993 | Sosa Quintana et al. | ..................... | 340/870.02 |
| 5,280,498 A | 1/1994 | Tymes et al. | .................... | 375/1 |
| 5,280,499 A | 1/1994 | Suzuki | ........................ | 375/1 |
| 5,285,469 A | 2/1994 | Vanderpool | ..................... | 375/1 |
| 5,287,287 A | 2/1994 | Chamberlain et al. | ........ | 364/483 |
| 5,289,497 A | 2/1994 | Jacobson et al. | ................. | 375/1 |
| 5,307,349 A | 4/1994 | Shloss et al. | ................. | 370/85.2 |
| 5,315,531 A | 5/1994 | Oravetz et al. | ............... | 364/550 |
| 5,319,679 A | 6/1994 | Bagby | ........................ | 375/106 |
| 5,329,547 A | 7/1994 | Ling | ........................ | 375/1 |
| 5,345,225 A | 9/1994 | Davis | ........................ | 340/635 |
| 5,359,625 A | 10/1994 | Vander Mey et al. | ........... | 375/1 |
| 5,381,462 A | 1/1995 | Larson et al. | ................. | 379/107 |
| 5,383,134 A | 1/1995 | Wrzesinski | ................. | 364/514 |
| 5,384,712 A | 1/1995 | Oravetz et al. | ................. | 364/550 |
| 5,387,873 A | 2/1995 | Muller et al. | ................. | 327/155 |
| 5,390,360 A | 2/1995 | Scop et al. | ................. | 455/34.2 |
| 5,406,495 A | 4/1995 | Hill | ........................ | 364/483 |
| 5,416,917 A | 5/1995 | Adair et al. | ................. | 395/500 |
| 5,420,799 A | 5/1995 | Peterson et al. | ............. | 364/483 |
| 5,432,507 A | 7/1995 | Mussino et al. | ........ | 340/870.03 |
| 5,432,815 A | 7/1995 | Kang et al. | ................. | 375/200 |
| 5,438,329 A | 8/1995 | Gastouniotis et al. | .. | 340/870.02 |
| 5,448,570 A | 9/1995 | Toda et al. | ................. | 370/95.3 |
| 5,450,088 A | 9/1995 | Meier et al. | ................. | 342/51 |
| 5,452,465 A | 9/1995 | Geller et al. | ................. | 395/800 |
| 5,455,533 A | 10/1995 | Köllner | ..................... | 327/484 |
| 5,455,544 A | 10/1995 | Kechkaylo | ..................... | 332/103 |
| 5,455,822 A | 10/1995 | Dixon et al. | ..................... | 370/18 |
| 5,457,621 A | 10/1995 | Munday et al. | ................. | 363/56 |
| 5,457,713 A | 10/1995 | Sanderford, Jr. et al. | .... | 375/206 |
| 5,461,558 A | 10/1995 | Patsiokas et al. | ............. | 364/145 |

| | | | |
|---|---|---|---|
| 5,463,657 A | 10/1995 | Rice | 375/200 |
| 5,473,322 A | 12/1995 | Carney | 340/870.02 |
| 5,475,742 A | 12/1995 | Gilbert | 379/106 |
| 5,475,867 A | 12/1995 | Blum | 455/53.1 |
| 5,479,442 A | 12/1995 | Yamamoto | 375/206 |
| 5,481,259 A | 1/1996 | Bane | 340/870.03 |
| 5,491,473 A | 2/1996 | Gilbert | 340/870.01 |
| 5,493,287 A | 2/1996 | Bane | 340/825.52 |
| 5,495,239 A | 2/1996 | Ouellette | 340/870.02 |
| 5,497,424 A | 3/1996 | Vanderpool | 380/34 |
| 5,499,243 A | 3/1996 | Hall | 370/85.8 |
| 5,500,871 A | 3/1996 | Kato et al. | 375/208 |
| 5,511,188 A | 4/1996 | Pascucci et al. | 395/600 |
| 5,519,388 A | 5/1996 | Adair, Jr. | 340/870.02 |
| 5,522,044 A | 5/1996 | Pascucci et al. | 395/200.06 |
| 5,526,389 A | 6/1996 | Buell et al. | 375/200 |
| 5,528,507 A | 6/1996 | McNamara et al. | 364/483 |
| 5,528,597 A | 6/1996 | Gerszberg et al. | 370/95.3 |
| 5,539,775 A | 7/1996 | Tuttle et al. | 375/200 |
| 5,541,589 A | 7/1996 | Delaney | 340/870.02 |
| 5,544,036 A | 8/1996 | Brown, Jr. et al. | 364/145 |
| 5,546,424 A | 8/1996 | Miyake | 375/206 |
| 5,548,527 A | 8/1996 | Hemminger et al. | 364/492 |
| 5,548,633 A | 8/1996 | Kujawa et al. | 379/93 |
| 5,553,094 A | 9/1996 | Johnson et al. | 375/200 |
| 5,555,508 A | 9/1996 | Munday et al. | 364/492 |
| 5,559,870 A | 9/1996 | Patton et al. | 379/107 |
| 5,566,332 A | 10/1996 | Adair et al. | 395/600 |
| 5,572,438 A | 11/1996 | Ehlers et al. | 364/492 |
| 5,590,179 A | 12/1996 | Shincovich et al. | 379/107 |
| 5,592,470 A | 1/1997 | Rudrapatna et al. | 370/320 |
| 5,594,740 A | 1/1997 | LaDue | 379/59 |
| 5,602,744 A | 2/1997 | Meek et al. | 364/464.22 |
| 5,619,685 A | 4/1997 | Schiavone | 395/500 |
| 5,621,629 A | 4/1997 | Hemminger et al. | 363/56 |
| 5,627,759 A | 5/1997 | Bearden et al. | 364/483 |
| 5,631,636 A | 5/1997 | Bane | 340/825.69 |
| 5,640,679 A | 6/1997 | Lundqvist et al. | 455/33.2 |
| 5,659,300 A | 8/1997 | Dresselhuys et al. | 340/870.02 |
| 5,684,472 A | 11/1997 | Bane | 340/870.02 |
| 5,684,799 A | 11/1997 | Bigham et al. | 370/397 |
| 5,691,715 A | 11/1997 | Ouellette | 340/870.09 |
| 5,692,180 A | 11/1997 | Lee | 395/610 |
| 5,696,501 A | 12/1997 | Ouellette et al. | 340/870.02 |
| 5,696,765 A | 12/1997 | Safadi | 370/436 |
| 5,699,276 A | 12/1997 | Roos | 364/514 A |
| 5,715,390 A | 2/1998 | Hoffman et al. | 395/188.01 |
| 5,717,604 A | 2/1998 | Wiggins | 364/514 C |
| 5,745,901 A | 4/1998 | Entner et al. | 707/103 |
| 5,748,104 A | 5/1998 | Argyroudis et al. | 340/870.11 |
| 5,751,914 A | 5/1998 | Coley et al. | 395/51 |
| 5,751,961 A | 5/1998 | Smyk | 395/200.47 |
| 5,754,772 A | 5/1998 | Leaf | 395/200.33 |
| 5,754,830 A | 5/1998 | Butts et al. | 395/500 |
| 5,778,368 A | 7/1998 | Hogan et al. | 707/10 |
| 5,787,437 A | 7/1998 | Potterveld et al. | 707/103 |
| 5,790,789 A | 8/1998 | Suarez | 395/200.32 |
| 5,790,809 A | 8/1998 | Holmes | 395/200.58 |
| 5,805,712 A | 9/1998 | Davis | 380/50 |
| 5,808,558 A | 9/1998 | Meek et al. | 340/870.01 |
| 5,822,521 A | 10/1998 | Gartner et al. | 395/200.6 |
| 5,862,391 A | 1/1999 | Salas et al. | 395/750.01 |
| 5,872,774 A | 2/1999 | Wheatley, III et al. | 370/335 |
| 5,874,903 A | 2/1999 | Shuey et al. | 340/870.02 |
| 5,875,183 A | 2/1999 | Nitadori | 370/328 |
| 5,875,402 A | 2/1999 | Yamawaki | 455/502 |
| 5,897,607 A | 4/1999 | Jenney et al. | 702/62 |
| 5,898,387 A | 4/1999 | Davis et al. | 340/870.02 |
| 5,910,799 A | 6/1999 | Carpenter et al. | 345/333 |
| 5,943,375 A | 8/1999 | Veintimilla | 375/355 |
| 5,963,146 A | 10/1999 | Johnson et al. | 340/870.01 |
| 6,000,034 A | 12/1999 | Lightbody et al. | 713/202 |
| 6,041,056 A | 3/2000 | Bigham et al. | 370/395 |
| 6,067,029 A | 5/2000 | Durston | 340/870.03 |
| 6,073,174 A | 6/2000 | Montgomerie et al. | 709/224 |
| 6,078,251 A | 6/2000 | Landt et al. | 340/10.41 |
| 6,078,909 A | 6/2000 | Knutson | 705/59 |
| 6,088,659 A | 7/2000 | Kelley et al. | 702/62 |
| 6,100,817 A | 8/2000 | Mason, Jr. et al. | 340/870.02 |
| 6,112,192 A | 8/2000 | Capek | 705/59 |
| 6,150,955 A | 11/2000 | Tracy et al. | 340/870.02 |
| 6,160,993 A | 12/2000 | Wilson | 455/12.1 |
| 6,172,616 B1 | 1/2001 | Johnson et al. | 340/870.12 |
| 6,199,068 B1 | 3/2001 | Carpenter | 707/100 |
| 6,246,677 B1 | 6/2001 | Nap et al. | 370/346 |
| 6,504,357 B1 | 1/2003 | Hemminger et al. | 324/142 |

FOREIGN PATENT DOCUMENTS

| | | |
|---|---|---|
| EP | 0 092 303 B1 | 10/1986 |
| EP | 0 288 413 A1 | 10/1988 |
| EP | 0 395 495 A1 | 10/1990 |
| EP | 0 446 979 A1 | 9/1991 |
| EP | 0 462 045 A1 | 12/1991 |
| EP | 0 629 098 A2 | 12/1994 |
| GB | 2 095 879 | 10/1982 |
| GB | 2 118 340 A | 10/1983 |
| GB | 2 157 448 A | 10/1985 |
| GB | 2 177 805 A | 1/1987 |
| GB | 2 186 404 A | 8/1987 |
| GB | 2 222 898 A1 | 3/1990 |
| GB | 2 237 910 A | 5/1991 |
| JP | 59-229949 | 12/1984 |
| JP | 61-11680 | 1/1986 |
| JP | 61-38569 | 2/1986 |
| JP | 61-284670 | 12/1986 |
| JP | 01-239473 | 9/1989 |
| JP | 01-239475 | 9/1989 |
| JP | 02-67967 A | 3/1990 |
| JP | 4290593 A | 10/1992 |
| JP | 05-260569 | 10/1993 |
| JP | 8194023 A | 7/1996 |
| WO | 86/05887 | 10/1986 |
| WO | 93-02515 A1 | 2/1993 |
| WO | 93/04451 A1 | 3/1993 |
| WO | 95/32595 A1 | 11/1995 |
| WO | 96/10856 A1 | 4/1996 |

OTHER PUBLICATIONS

International Search Report issued in International Application No. PCT/US98/11170 Date of Mailing: Oct. 7, 1998.

International Search Report issued in International Application No. PCT/US98/19034 Date of Mailing: Feb. 1, 1999.

Internet Printout, http://www.ram.com, BellSouth Wireless Data—Paging, Mobitex, Network, Business, Sep. 23, 1998:, —Mobitex®: The Heart of Every BellSouth Solution, —Mobitex Features and Services: RAM Mobile Data White Paper, Feb. 1997, —Narrowband PCS Technologies: What are the Options?: RAM Mobile Data White Paper, Nov. 1997, —The Inherent Security of Data Over Mobitex Wireless Packet Data Networks, A RAM Mobile Data White Paper, Oct. 1995, —Comparative Analysis of Coverage and Performance: RAM & Ardis, 1998.

Internet Printout, http://www.ardis.com, "Ardis Two-Way, Wireless Data Communications," Ardis, Sep. 23, 1998.

Internet Printout, http://www.ardis.com/RADIO, "An Overview of Radio Coverage," Sep. 29, 1998, "Radio Propagation," Sep. 29, 1998, "Factors Affecting Ardis Coverage," Sep. 29, 1998, "The Ardis Network Compared to Other Systems," Sep. 29, 1998.

Internet Printout, http://www.ardis.com/RADIO, "Radio Coverage," Sep. 29, 1998, "Glossary of Terms," Sep. 29, 1998, "Radio Propagation in Free Space," Sep. 29, 1998, "Real World Propagation Variations," Sep. 29, 1998, "Probability of Reception vs. Calculation," Sep. 29, 1998.

Markwalter, B. E. et al., "CEBus Network Layer Description," *IEEE Transactions on Consumer Electronics*, Aug. 1989, 35(3), 571-576.

"MV-90 Read Only System" UTS Software Solutions For Utility Customers. (No. Date). (No Page Numbers or Pages).

Newton, H., *Newton's Telecom Dictionary*, CMP Books, 17th Ed., 2001, Pages: LAN (p. 394); CEBUS (p. 134).

Rappaport, T.S., "Wireless Communications, Principles and Practice," Prentice Hall PTR, 1996, pp. 410-413.

"Enter the Electronic Metering Age with GE, The Electronic Polyphase Demand Meter, Ge electronic Metering", *GE Meters Brochure*, Somersworth, NH, Sep. 1989.

Kingston, G.A. et al., "Multi Function Polyphase Metering- An Integrated Approach", *Schlumberger Industries Electricity Management*, UK.

Garverick, S. L. et al., "A Programmable Mixed-Signal ASIC of Power Metering", *IEEE Journal of Solid State Circuits*, 1991, 26 (12), 2008-2016.

Gaverick, S.L. et al., "A Programmable Mixed-Signal ASIC for Power Metering", *IEEE International Solid State Circuits Conference*, 1991, 36-37.

Kohler, H., Elektronischer Hochprazisionzahler im 19-Zoll-Einbaughehause fur Wirkverbrauch-und Blindverbrauchzuhlung, *Siemens Magazine*, 1977, 345-349.

Eggenberger, H.P., "An Electronic Electricity Meter for Active and Reactive Energy Consumption", *Nue Zurcher Zeitung*, Sep. 6, 1989.

In the Matter of Australian Patent Application 688711 in the name of ABB Power T&D Company, Inc., and In the Matter of Opposition Thereto by Electrowatt Technology Innovation Corporation, *Revised Statement of Grounds and Particulars in Support of Opposition*, Feb. 19, 1999.

In the Matter of Australian Patent Application No. 688711 in the name of ABB Power T & D Co. Inc and in the matter of Opposition thereto by Electrowatt Technology Innovation Corp., Statement of Grounds and Particulars in Support of Opposition, Aug. 12, 1998.

Landis & Gyr, "Electronic Meter, Class 0, 2:ZFRI, ZNRI," Jul. 1971.

Landis & Gyr Instruction/Technical Manual, Solid State Meter Class 20, Form 9s, Bulletin 920, Lafayette, IN, Aug. 4, 1987.

Landis & Gyr, Bulletin 930 SSM2 Instruction/Technical Manual Polyphase Solid State Meter, Landis & Gyr, Lafayette, Indiana, (date available).

Landis & Gyr, ZMA11m402-Solid State Precision Meter IEC Class 1.0.

Landis & Gyr, "Z.T. Precision Solid-State Meters", Oct. 1988.

Laumann, H. et al., "Class 0,5 Precision Meter With Solid-State Measuring Elements", Landis & Gyr Review, Sep. 1974.

Lester, G., "A Communications Protocol for Reading and Programming Electronic Metering Devices from Hand Held Units", GEC Meters, UK.

Schwendtner, M. et al., "Elektronischer Haushaltszahler" Elektrontechnische Zeitschrift etz, vol. 112, 6(7), 1991, 320-323.

McGrath, D.T., "Signal Processing Considerations in Power Management Applications", *GE Corporate Research and Development*, 1991.

MT100 electronic Time-of-Use Register Instruction Manual 0505, Schlumberger Industries, Dec. 1991.

Negahaban, M., "A DSP Based Watthour Meter", *Silicon Systems, Inc.*, Nov. 23, 1988.

Negahban, M. et al., "A DSP-Based Watthour Meter", *IEEE International Solid State ircuits Conference Digest of Technical Papers 36th ISSC 1st Ed.*, NY, NY, USA, Feb. 15-17, 1989.

Nilsen, "EMS 2100 Electricity Consumption Analyzer-Australian Design Award", 1998, 1-16.

Hutt, P.R. et al. "Design, Benefits and Flexibility in Intelligent Metering Technology", *Polymeters Limited*, UK.

Product Brochure: "KVI Polyphase Combination Meter", Jul. 1988.

Progress in the Art of Metering Electric Energy, *The Institute of Electrical & Electronics Engineers, Inc*, Electricity Metering Subcommittee, 1969.

QUAD4® Plus Multifunction Electronic Meter, User's Guide, Document A-117350, Revision L., Process Systems, Charlotte, NC, 1993.

Quantum Multi-Function Polyphase Meter Type SQ400, Preliminary Instruction Manual Draft III, Mar. 1983.

Quantum Technical Guide, Jul. 1898.

ST-MT 100 Electronic Time-of-Use Instruction Manual 0505, Sangamo Westing, Inc., May 1987.

Quantum.RTM. Electronics Meter Filed Reference Manual for Q101, Q111, Q121, Q200, Q210, Q220 and Q230 Electronic Meters, Schlumberger Industries, prior to Jan. 1991.

ST-DS130 Recorder Module Product Bulletin 13157, Schlumberger Industries, Sep. 1988.

ST-Q101 Series Electronic Meter, Product Bulletin 10253, Schlumberger Industries, Sep. 1988.

ST-Q200 Series System Measurement, Product Bulletin 10255, Schlumberger Industries, 1988.

ST-Q200 Series System Measurement , Product Bulletin 10255, Schlumberger Industries, Nov. 1990.

Su, K. L., "Fundamentals of Circuits, Electronics and Signal Analysis", *Georgia Institute of Technology*, Atlanta, Ga, Dec. 1996, 1, 61-63.

Summers, R., Integrated Semiconductor Solutions for Metering and Telemetering Applications, Apr. 1990, Texas Instruments.

Three-Phase, Watt-Hour Meter IC, *Electronic Design*, Feb. 23, 1989.

Usenko, VV. Et al., "Meter for Recording the Energy of Single and Rarely-Repeating Ultrahigh-Energy Pulses", *Radiotekhnika, Kharkov*, Ukranian SSR, 1988, 86, 44-48.

In the Matter of Australian Patent Application No. 688711 in the name of ABB Power T & D Co. Inc and in the Matter of Opposition thereto by Electrowatt Technology Innovation Corp., Patents Act 1990, Decision of a Delegate of the Commisioner of Patents, Dec. 19, 2000, 14 pages.

Gow, J., *Electricial Metering Practices*, 1973 (physical copy unavailable).

Handbook for Electricity Metering, 1981 (Physical copy unavailable).

* cited by examiner

SWITCH TO BYPASS OPTICAL DIODE FOR REDUCING POWER CONSUMPTION OF ELECTRICAL METERS

CROSS REFERENCE TO RELATED APPLICATIONS

This application is a divisional of U.S. application Ser. No. 10/803,212, filed Mar. 18, 2004 now U.S. Pat. No. 7,315,162, which is incorporated by reference herein in its entirety.

FIELD OF THE INVENTION

The invention relates generally to the field of electric utility meters. More specifically, the invention relates to techniques for reducing the power consumed by electric utility meters.

BACKGROUND OF THE INVENTION

Electric utility companies and power consuming industries have in the past employed a variety of approaches to metering electrical energy. Typically, a metering system monitors power lines through isolation and scaling components to derive polyphase input representations of voltage and current. These basic inputs are then selectively treated to determine the particular type of electrical energy being metered. Because electrical uses can vary significantly, electric utility companies have requirements for meters configured to analyze several different nominal primary voltages, the most common of which are 96, 120, 208, 240, 277 and 480 volts RMS.

Electric utility meters employing electronic components instead of electromechanical components have become more widely used in the industry. The use of electronic components including microprocessor components have made electricity metering faster and more accurate. Unlike the former electromechanical components, however, the electronic components in the meter require power to operate. Usually, direct current (DC) power is required to operate the meter's electronic components. Of course, the meters typically receive and monitor alternating current (AC) power from the power distribution system. Therefore, electronic meters use power supply devices to generate DC power from the already-available and constantly-present line voltage. As discussed in U.S. Pat. No. 5,457,621, which is incorporated herein by reference, power supply devices have been created to generate the required microprocessor DC power regardless of the value of the available line voltages (e.g., 96 to 480 volts RMS).

Even with the shift away from electromechanical meters to electronic meters, the cost of the product is a meaningful consideration. The power supply component for the electronic meter typically represents a significant portion of the overall cost of the meter. In addition, the power supply's cost is dependent largely on the amount of power consumed by the electronic components in the meter. Therefore, reducing the cost of the meter involves considering techniques for reducing the amount of power consumed by the electronic components, and using lower cost components, whenever possible.

Attempting to use lower cost components and reduce power consumption to keep meter costs down is relevant to any meter environment, and particularly the residential meter environment. For example, although the invention is not limited to this application alone, 240 VAC residential meters often use limited current, fixed voltage capability power supplies (e.g., a linear capacitive divider power supply), which apply even greater power constraints on the power supply.

Electronic meters often employ an optical communications port used to determine electrical usage, to read the meter, and/or to provide meter indicators and test features. In order to provide such data via the optical communications port, an optical diode is used. The optical diode or light emitting diode (LED) operates as a transducer to convert electrical energy provided to it by the other meter components to light or other optical signals. The optical signal is communicated with a communications port that provides the light external to the meter. In this way, an optical receiving device may be placed over the optical communications port to receive the data processed by the meter. In an electronic meter, the power required to operate the optical diode often is equal to or even more than the power required by the other electronic circuits combined.

Therefore, there is a need to reduce the amount of power consumed by an electronic meter, and particularly by the optical diode.

SUMMARY OF THE INVENTION

The invention contemplates an electrical power meter and method of operating the electrical power meter. The inventive power meter includes a power supply for converting alternating current (AC) voltage to a direct current (DC) voltage for powering the electronic components, and an optical diode in series with the power supply. The meter may also include an optical communications port in communication with the optical diode and/or a switch (e.g., a transistor) in communication with the optical diode. The switch may be in parallel with the optical diode, and allow DC current to bypass the optical diode when a request for communication is received by the meter. The DC current provided to the optical diode represents communication of data with an optical communications port. The switch may be controlled by a microprocessor device The meter also may include a buffer transistor in series connection with the switch and a microprocessor for controlling operation of the buffer transistor. The meter also may include a first resistor in series connection with the switch and a second resistor in parallel connection with the switch. The AC voltage may be provided to the power supply via an electric power line. The optical communications port may provide data relating to the operation of the meter. The power supply may be capable of providing power just sufficient to operate the optical diode and the electronic components.

The invention also contemplates a method of reducing power consumed by an electronic utility power meter having electronic components. The inventive method includes receiving AC power from an electric power line, converting the AC power to a DC power, providing the DC power to the electronic components, and reducing the DC power provided to an optical diode in series. The inventive method may further include providing DC current from a power supply in series connection with the optical diode and to electronic components in a parallel circuit configuration. The method may further include switching a DC current provided to the optical diode by the power supply and bypassing the DC current around the optical diode. When a request for communication with the meter is received, the inventive method may provide the DC current to the optical diode in response to the request for communication.

DETAILED DESCRIPTION OF ILLUSTRATIVE EMBODIMENTS

Figure 1:
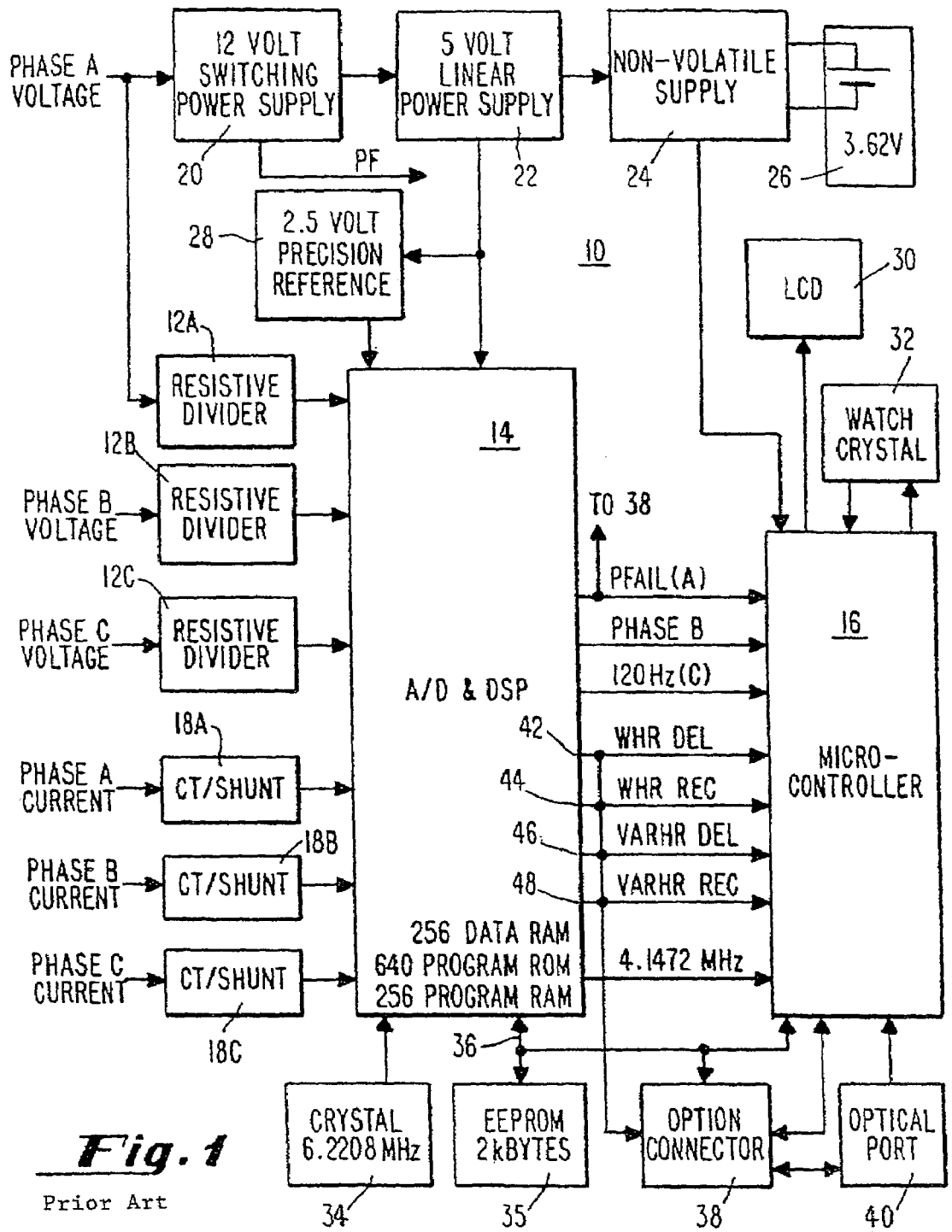
FIG. 1 is a block diagram of an electronic meter.

FIG. 1 is a block diagram of an electronic meter. As shown in FIG. 1, meter 10 is shown to include three resistive voltage divider networks 12A, 12B, 12C; a first processor—an ADC/DSP (analog-to-digital converter/digital signal processor) chip 14; a second processor—a microcontroller 16 which in the preferred embodiment is a Mitsubishi Model 50428 microcontroller; three current sensors 18A, 18B, 18C; a 12 V switching power supply 20 that is capable of receiving inputs in the range of 96-528 V; a 5 V linear power supply 22; a nonvolatile power supply 24 that switches to a battery 26 when 5 V supply 22 is inoperative; a 2.5 V precision voltage reference 28; a liquid crystal display (LCD) 30; a 32.768 kHz oscillator 32; a 6.2208 MHz oscillator 34 that provides timing signals to chip 14 and whose signal is divided by 1.5 to provide a 4.1472 MHz clock signal to microcontroller 16; a 2 kByte EEPROM 35; a serial communications line 36; an option connector 38; and an optical communications port 40 that may be used to read the meter. The inter-relationship and specific details of each of these components is set out more fully below.

It will be appreciated that electrical energy has both voltage and current characteristics. In relation to meter 10 voltage signals are provided to resistive dividers 12A-12C and current signals are induced in a current transformer (CT) and shunted. The output of CT/shunt combinations 18A-18C is used to determine electrical energy.

First processor 14 is connected to receive the voltage and current signals provided by dividers 12A-12C and shunts 18A-18C. As will be explained in greater detail below, processor 14 converts the voltage and current signals to voltage and current digital signals, determines electrical energy from the voltage and current digital signals and generates an energy signal representative of the electrical energy determination. Processor 14 will always generate a watthour delivered (Whr Del) and, watthour received (Whr Rec), depending on the type of energy being metered, will generate either a volt amp reactive hour delivered (Varhr Del)/a volt amp reactive hour received (Varhr Rec) signal or volt amp hour delivered (Vahr Del)/volt amp hour received (Vahr Rec) signal. In the preferred embodiment, each transition on conductors 42-48 (each logic transition) is representative of the measurement of a unit of energy. Second processor 16 is connected to first processor 14. As will be explained in greater detail below, processor 16 receives the energy signal(s) and generates an indication signal representative of said energy signal.

It will be noted again that meter 10 is a wide range meter capable of metering over a voltage range from 96-528 V. The components which enhance such a wide range meter include the divider network 12A-12C, which as previously noted are connected to receive the voltage component. The dividers generate a divided voltage, wherein the divided voltage is substantially linear voltage with minimal phase shift over the wide dynamic range, i.e. 96-528 Volts. A processing unit (processors 14 and 16) is connected to receive the divided voltage and the current component. The processing unit processes the divided voltages and the current components to determine electrical energy metering values. It will be appreciated from the following description that processors 14 and 16 require stable supply voltages to be operable. A power supply, connected to receive the voltage component and connected to processors 14 and 16, generate the necessary supply voltages from the Phase A voltage component over the wide dynamic range. Power supply 20 could also run off of phase B and phase C voltages or a combination of the above. However, a combination embodiment would require additional protection and rectifying components.

In relation to the preferred embodiment of meter 10, currents and voltages are sensed using conventional current transformers (CT's) and resistive voltage dividers, respectively. The appropriate multiplication is accomplished in a new integrated circuit, i.e. processor 14. Processor 14 is essentially a programmable digital signal processor (DSP) with built in multiple analog to digital (A/D) converters. The converters are capable of sampling multiple input channels simultaneously at 2400 Hz each with a resolution of 21 bits and then the integral DSP performs various calculations on the results. For a more detailed description of Processor 14, reference is made to a co-pending application Ser. No. 839, 182 filed on Feb. 21, 1992, and abandoned in favor of application Ser. No. 259,578, which is incorporated herein by reference and which is owned by the same assignee as the present application.

Meter 10 can be operated as either a demand meter or as a time-of-use (TOU) meter. It will be recognized that TOU meters are becoming increasingly popular due to the greater differentiation by which electrical energy is billed. For example, electrical energy metered during peak hours will be billed differently than electrical energy billed during non-peak hours. As will be explained in greater detail below, first processor 14 determines units of electrical energy while processor 16, in the TOU mode, qualifies such energy units in relation to the time such units were determined, i.e. the season as well as the time of day.

All indicators and test features are brought out through the face of meter 10, either on LCD 30 or through optical communications port 40. Power supply 20 for the electronics is a switching power supply feeding low voltage linear supply 22. Such an approach allows a wide operating voltage range for meter 10.

In the preferred embodiment of the present invention, the so-called standard meter components and register electronics are for the first time all located on a single printed circuit board (not shown) defined as an electronics assembly. This electronics assembly houses power supplies 20, 22, 24 and 28, resistive dividers 12A-12C for all three phases, the shunt resistor portion of 18A-18C, oscillator 34, processor 14, processor 16, reset circuitry, EEPROM 35, oscillator 32, optical port components 40, LCD 30, and an option board interface 38. When this assembly is used for demand metering, the billing data is stored in EEPROM 35. This same assembly is used for TOU metering applications by merely utilizing battery 26 and reprogramming the configuration data in EEPROM 35. The additional time-of-use billing data is stored in the internal RAM of processor 16, which RAM is backed by battery 26.

Consider now the various components of meter 10 in greater detail. Primary current being metered may be sensed using conventional current transformers. The shunt resistor portion of devices 18A-18C are located on the electronics assembly.

The phase voltages are brought directly to the electronic assembly where resistive dividers 12A-12C scale these inputs to processor 14. In the preferred embodiment, the electronic components are referenced to the vector sum of each line voltage for three wire delta systems and to earth ground for all other services. Resistive division is used to divide the input voltage so that a very linear voltage with minimal phase shift over a wide dynamic range can be obtained. This in combination with a switching power supply allows the wide voltage operating range to be implemented.

Consider now the particulars of the power supplies shown in FIG. 1. As indicated previously, the off-line switching supply 20 is designed to operate over a 96-528 VAC input range. It connects directly to the Phase A voltage alternating current (AC) line and requires no line frequency transformer. A flyback converter serves as the basis of the circuit. A flyback converter is a type of switching power supply.

As used herein, the "AC cycle" refers to the 60 Hz or 50 Hz input to power supply 20. The "switching cycle" refers to the 50 kHz to 140 kHz frequency at which the switching transformer of power supply 20 operates. It will be noted that other switching cycle frequencies can be used.

Figure 2:
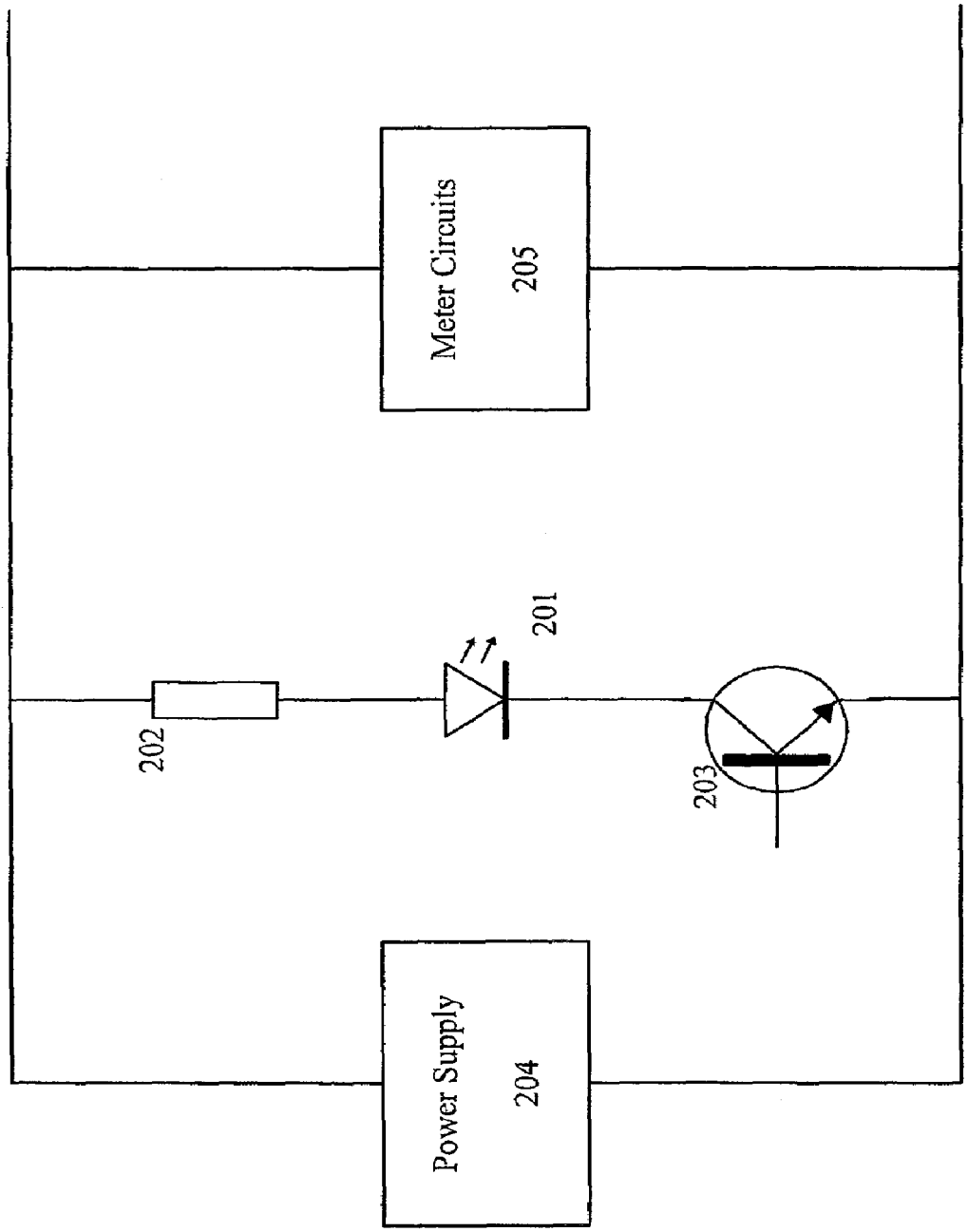
FIG. 2 is a schematic diagram of an optical port circuit.

FIG. 2 is a schematic diagram of an optical port circuit. As shown in FIG. 2, a power supply 204 provides DC voltage an optical diode 201, a resistor 202, a transistor 203, and meter circuits 205. Optical diode 201, resistor 202, transistor 203, and meter circuits 205 are connected in parallel with the output of power supply 204. As a result, the signals provided by optical diode 201 are proportional to the power consumed by the meter. For example, optical diode 201 may requires 10 milliamps (mA) of current from power supply 204 to communicate with equipment external to the meter. The required 10 mA is delivered by power supply 204 in addition to the other electronic components (now shown in FIG. 2) that power supply 204 provides power.

Figure 3:
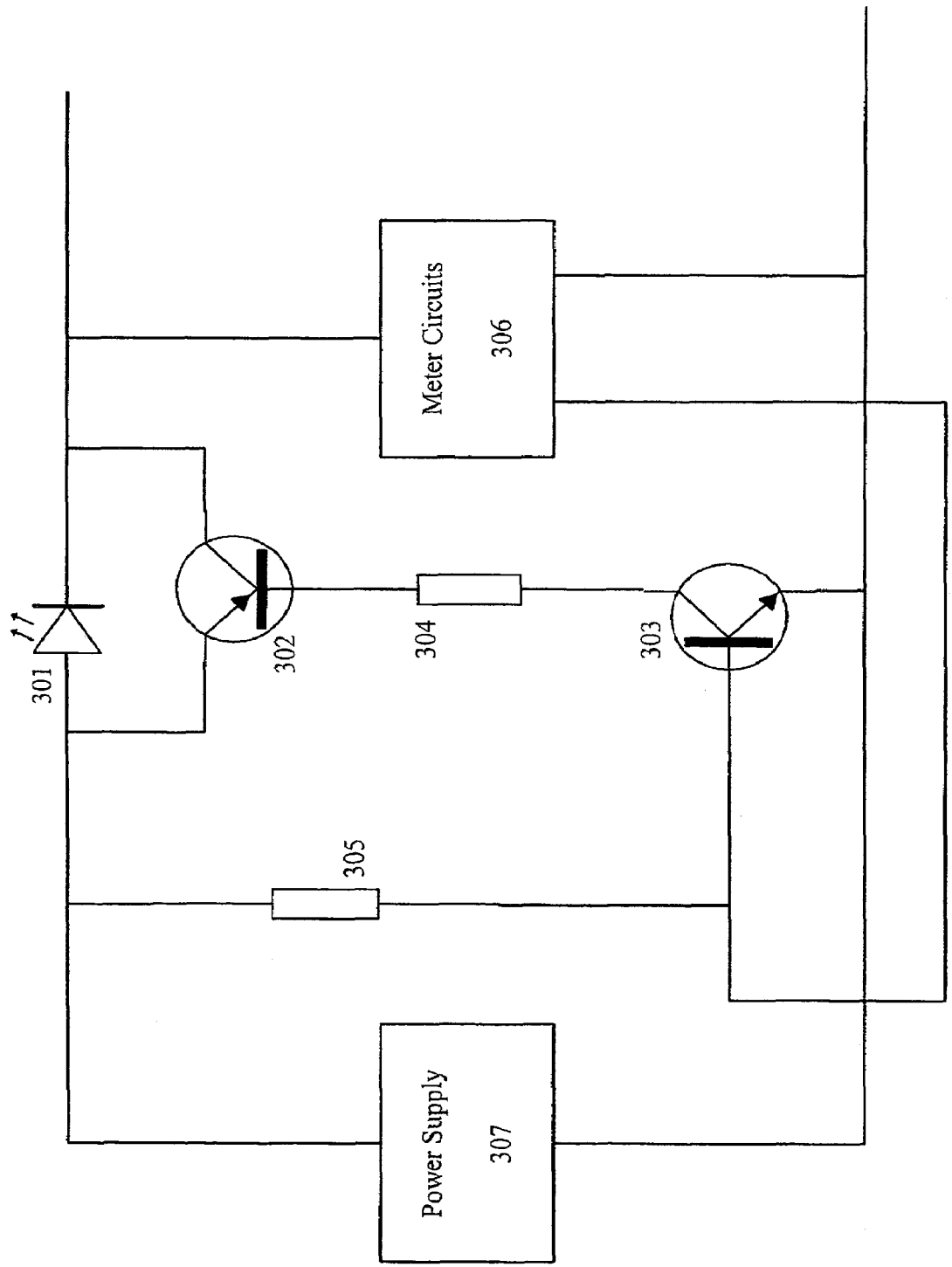
FIG. 3 is a schematic diagram of an optical port circuit, according to the invention.

FIG. 3 is a schematic diagram of an optical port circuit, according to the invention. As shown in FIG. 3, an optical diode 301 is connected in series with a power supply 307. As a result, the DC current provided by power supply 301 may be provided to the remainder of metering circuits 306 via optical diode 301 with little or no additional consumption of current by optical diode 301. This is due to the fact that power supply 307 is burdened to provide additional voltage to accommodate the voltage drop across series-connected optical diode 301, rather than rather having to provide additional DC current required a parallel-connected optical diode current at full DC voltage.

As shown in FIG. 3, a switching transistor 302 is in parallel with optical diode 301. Also, a resistor 304 and a switching transistor 303 are in series with transistor 302. A resistor 305 is in parallel both with power supply 307 and with transistor 302, resistor 304 and transistor 303. The DC current provided by power supply 307 to metering circuits 306 is in series connection with optical diode 301 and transistor 302. In one mode, transistor 302 is conducing current (e.g., saturated) and thus bypassing the DC current around optical diode 301. When the electrical meter is required to communicate information thru an external communications port using the optical diode 301, meter circuits cause transistor 302 to open, thus allowing optical diode to conduct the DC current provided by power supply.

Such external meter communication may be activated automatically or via external human input, for example. In either case, the switching of transistor 302 may be controlled by meter circuits 306 in response to automatic or initiated request, as indicated above. Meter circuits 306 may then provide an optical control signal to transistor 303. Transistor 303 in cooperation with resistors 304 and 305 operate to control the switching of transistor 302, and thus the switching of optical diode 301, as described above. For example, in one embodiment, the signal from meter circuits 306 may be provided by a microprocessor (not shown) that would short the base emitter of transistor 303 (acting as a buffer to transistor 302) and cause transistor 302 to stop conducting DC current, thus allowing optical diode 301 to conduct current and provide the required external communication. When the external communication ceases, transistor 302 again is switched on and conducts the DC current, thus bypassing the DC current from optical diode 301.

It is to be understood that the foregoing illustrative embodiments have been provided merely for the purpose of explanation and are in no way to be construed as limiting of the invention. Words used herein are words of description and illustration, rather than words of limitation. In addition, the advantages and objectives described herein may not be realized by each and every embodiment practicing the present invention. Further, although the invention has been described herein with reference to particular structure, materials and/or embodiments, the invention is not intended to be limited to the particulars disclosed herein. Rather, the invention extends to all functionally equivalent structures, methods and uses, such as are within the scope of the appended claims.

Those skilled in the art, having the benefit of the teachings of this specification, may affect numerous modifications thereto and changes may be made without departing from the scope and spirit of the invention.

What is claimed is:

1. A method of reducing power consumed by an electronic utility power meter, comprising:
  receiving an alternating current (AC) power from an electric power line;
  converting the AC power to a direct current (DC) power with a power supply;
  providing the DC power to a metering circuit, wherein an optical diode is in series with the power supply and the metering circuit, and wherein the optical diode is in parallel with the power supply and a switch; and
  reducing the DC power provided to the optical diode.

2. The method of claim 1, further comprising the optical diode converting an electrical signal to an optical signal.

3. The method of claim 1, further comprising communicating the optical signal with an optical communications port.

4. The method of claim 1, wherein the power supply is capable of providing power sufficient to operate the optical diode and the metering circuit.

5. The method of claim 1, further comprising switching a DC current provided to the optical diode by the power supply.

6. The method of claim 5, wherein the switching is done via a transistor.

7. The method of claim 6, further comprising a first resistor in series connection with the transistor.

8. The method of claim 6, further comprising a second resistor in parallel connection with the transistor.

9. The method of claim 5, wherein the DC current provided to the optical diode represents data related to the operation of the meter.

10. The method of claim 5, further comprising controlling the switching with a microprocessor device.

11. The method of claim 5, wherein the switching allows DC current to bypass the optical diode.

12. The method of claim 1, further comprising bypassing the DC current around the optical diode.

13. The method of claim 1, further comprising:
  receiving a request for communication; and
    providing the DC current to the optical diode in response to the request for communication.

14. The method of claim 1, wherein the optical diode is a light emitting diode.

15. The method of claim 1, wherein the optical diode causes a voltage drop of the DC power provided by the power supply.

* * * * *